(12) United States Patent
Klapper

(10) Patent No.: US 10,514,402 B2
(45) Date of Patent: Dec. 24, 2019

(54) CONTACT-MAKING DEVICE AND METHOD FOR MAKING ELECTRICAL CONTACT WITH A TEST OBJECT

(71) Applicant: OMICRON ELECTRONICS GMBH, Klaus (AT)

(72) Inventor: Ulrich Klapper, Rankweil (AT)

(73) Assignee: OMICRON ELECTRONICS GMBH, Klaus (AT)

( * ) Notice: Subject to any disclaimer, the term of this patent is extended or adjusted under 35 U.S.C. 154(b) by 393 days.

(21) Appl. No.: 15/315,468

(22) PCT Filed: May 29, 2015

(86) PCT No.: PCT/EP2015/061988
§ 371 (c)(1),
(2) Date: Dec. 1, 2016

(87) PCT Pub. No.: WO2015/185456
PCT Pub. Date: Dec. 10, 2015

(65) Prior Publication Data
US 2017/0089965 A1    Mar. 30, 2017

(30) Foreign Application Priority Data

Jun. 2, 2014   (AT) .............................. A 50383/2014

(51) Int. Cl.
*G01R 31/02*    (2006.01)
*G01R 31/327*   (2006.01)
(Continued)

(52) U.S. Cl.
CPC ........... *G01R 27/14* (2013.01); *G01R 31/006* (2013.01); *G01R 31/327* (2013.01);
(Continued)

(58) Field of Classification Search
CPC .............. G01R 31/327; G01R 31/3277; G01R 31/3275; G01R 31/3278; G01R 31/3274; G01R 31/006
(Continued)

(56) References Cited

U.S. PATENT DOCUMENTS 6,160,685 A * 12/2000 Hamilton ............. G11B 5/3106
                                                    360/246.2
6,231,360 B1 * 5/2001 Horie ..................... G06K 13/08
                                                    439/159
(Continued)

FOREIGN PATENT DOCUMENTS

DE   10 2004 017 101 A1   7/2005
GB        1 427 787 A     3/1976
JP        2001135382 A    5/2001

OTHER PUBLICATIONS

International Search Report issued in PCT/EP2015/061988, dated Aug. 26, 2015.

*Primary Examiner* — Raul J Rios Russo
(74) *Attorney, Agent, or Firm* — Mintz Levin Cohn Ferris Glovsky and Popeo, P.C.; Peter F. Corless; Steven M. Jensen

(57) ABSTRACT

A contact-making device (10) is used for a resistance measurement on a test object (30). The test object (30) comprises a threaded hole (31), which has an internal thread (32). The contact-making device (10) is designed to be mechanically coupled to the internal thread (32) of the threaded hole (31). The contact-making device (10) comprises a first contact (11) and a second contact (12), in order to make electrical contact with the test object (30) at, at least, two points when the contact-making device (10) is mechanically coupled to the internal thread (32). The first contact (Continued)

(11) and the second contact (12) are electrically insulated from one another by an insulating material (15-17) in the contact-making device (10).

16 Claims, 3 Drawing Sheets

(51) Int. Cl.
    *G01R 27/14*     (2006.01)
    *G01R 31/00*     (2006.01)
    *H01R 4/30*     (2006.01)
    *H01R 4/34*     (2006.01)
    *H01R 11/18*     (2006.01)
    *H01R 11/32*     (2006.01)
    *H01R 11/24*     (2006.01)

(52) U.S. Cl.
    CPC ..... *G01R 31/3274* (2013.01); *G01R 31/3275* (2013.01); *G01R 31/3277* (2013.01); *H01R 4/308* (2013.01); *H01R 4/34* (2013.01); *H01R 11/18* (2013.01); *H01R 11/32* (2013.01); *H01R 11/24* (2013.01)

(58) Field of Classification Search
    USPC .................................................. 324/415–424
    See application file for complete search history.

(56) References Cited

U.S. PATENT DOCUMENTS

| | | | |
|---|---|---|---|
| 8,702,456 B1 | 4/2014 | Wang | |
| 2004/0034839 A1* | 2/2004 | Saunders | G01R 1/06772 438/18 |
| 2005/0183966 A1* | 8/2005 | Kaz | H01M 8/1018 205/775 |
| 2009/0027038 A1* | 1/2009 | Garmire | G01B 9/02 324/95 |
| 2013/0043896 A1* | 2/2013 | Pan | G01R 31/2806 324/756.01 |
| 2014/0113478 A1 | 4/2014 | Yeung et al. | |

* cited by examiner

CONTACT-MAKING DEVICE AND METHOD FOR MAKING ELECTRICAL CONTACT WITH A TEST OBJECT

CROSS-REFERENCE TO RELATED APPLICATIONS

This application is a National Phase application filed under 35 U.S.C. § 371 of PCT International Application No. PCT/EP2015/061988, with an International Filing Date of May 29, 2015, which claims under 35 U.S.C. § 119(a) the benefit of Austrian Application No. A50383/2014, filed Jun. 2, 2014, the entire contents of which are incorporated herein by reference.

FIELD OF THE INVENTION

The invention concerns a contact-making device for making electrical contact with a test object, a system with such a contact-making device and a method for making electrical contact with a test object for resistance measurement.

BACKGROUND

Following production or, later, when in operation, many electrical elements must have their electrical conductivity tested. To this end, resistance measurements can be carried out. Typical examples of such measurements are resistance measurements of switches or isolators for high-voltage networks or medium-voltage networks in the closed state.

A measuring technique for a resistance measurement on such switches, designed for high currents, is micro-ohm measurement. In micro-ohm measurement a direct current with a relatively high current strength, for example with a current strength of between 10 and 1,000 Amperes, is impressed by the test object. By means of separate terminals the drop in voltage is measured over a portion on the test object.

Such measurement techniques, in which separate measurement contacts are used to impress the current and to capture the drop in voltage, are also referred to as four-point measurements. Such methods have the advantage that contact resistances between the measurement contacts and the test object have only a slight effect on the measured resistance. In the contacts used to impress the current, the resistance plays no role because only the necessary driving voltage at the voltage source increases as a result. But this has no effect on the measured voltage. At the contacts via which the voltage is measured, only a low current flows, since the voltage measuring device is high-impedance. Therefore, there is no significant drop in voltage on the voltage terminals either, which could falsify the measured voltage.

The spatial area, for measurement of the voltage dropping across it, is defined by the position of the contacts which are applied to the test object for the voltage measurement. With very many test objects in power engineering, such as, for example, high-voltage switches, the areas to which the contacts for measurement are applied, are solid metal parts with high conductivity. The relevant resistances are for example evident at screw positions, abutting or clamping points or switching contacts of closed switches or isolators. The precise positions at which the contacts are applied, do not significantly influence the measurement result of the resistance measurement. But it is very important to keep the contact made for the current path and the contact made for the voltage path totally separate.

With many test objects a connection point may be present, having an internal thread. In normal operation such a connection point can have a good electrical conductor connected to it. Often, however, the connection point has small dimensions. This makes it difficult to keep the contact made for the current path and the contact made for the voltage path totally separate, if a contact for the current path and a contact for the voltage path are to be applied at the connection point.

SUMMARY

The object of exemplary embodiments of the invention is to enable a secure and simple contact to be made with a test object for a resistance measurement, when the test object has a threaded hole with an internal thread. It is particularly desirable to make electrical contact with such a test object, for example a switch or isolator for high-voltage networks or medium-voltage networks, so that both a contact for the current path and a contact for the voltage path can be reliably applied at the connection point.

According to exemplary embodiments a contact-making device for a resistance measurement is provided, that can be used for a test object comprising a threaded hole with an internal thread. The contact-making device is structured so that it can be mechanically secured to the internal thread. To this end the contact-making device can be structured for a thread engagement with the internal thread of the test object. Alternatively, or additionally, the contact-making device can have teeth able to engage with at least one thread turn of the internal thread. The contact-making device has a first contact and a second contact. The first contact and the second contact are electrically insulated from one another in the contact-making device. The first contact and the second contact can be mechanically connected to one another in the contact-making device, to allow joint and simple installation. The first contact and the second contact are arranged so that they make electrical contact with the test object at different positions, when the contact-making device is mechanically coupled to the internal thread.

The contact-making device can be structured as a clamp. The contact-making device can be structured as an electrical connector. The contact-making device can have a screw-shaped form.

Through the first contact and the second contact both a contact for the voltage path and a contact for the current path of a four-point measurement can be created. To this end only the contact-making device has to be brought into engagement with the internal thread of the test object. The necessary further contact for the voltage path and the further contact for the current path can for example be achieved by using a further contact-making device according to an exemplary embodiment or by conventional contact terminals, connected to the test object.

The contact-making device can be temporarily or permanently connected to the internal thread of the test object.

At least one of the first contact and the second contact can have a protrusion, designed for engagement with the internal thread. The protrusion can be designed for form-fit engagement with the internal thread. In this way the contact-making device can be securely attached to the test object. The protrusion can be designed for a friction-type connection with the internal thread.

The contact-making device can be structured so that in the state in which the contact-making device is fastened to the internal thread of the test object, the first contact and the second contact both sit on a surface of the test object, which is different from the internal surface of the threaded hole.

The contact-making device can be structured so that in the state in which the contact-making device is secured to the internal thread of the test object, the first contact sits on the internal surface of the threaded hole and the test object makes electrical contact there, and that the second contact sits on a surface of the test object, which is different from an internal surface of the threaded hole.

The contact-making device can be structured so that in the state in which the contact-making device is secured to the internal thread of the test object, the first contact and the second contact sit on different areas of the internal surface of the threaded hole.

A contact-making device for making electrical contact with a test object, comprising a threaded hole with internal thread, is designed for a mechanical coupling with the internal thread of the threaded hole. The contact-making device comprises a first contact and a second contact, in order to make electrical contact with the test object at, at least, two points, when the contact-making device is mechanically coupled to the internal thread of the threaded hole. The first contact and the second contact are electrically insulated from one another by an insulating material in the contact-making device.

The contact-making device can have a threaded portion, that can be screwed into the threaded hole of the test object. The contact-making device can be screw-shaped. In this way the contact-making device can be secured in a simple manner to the test object to create a conductive connection for a current path and a conductive connection for a voltage path.

The contact-making device can have an external thread. The external thread can be provided on the threaded portion. The external thread can be designed for a thread engagement with the threaded hole of the test object. The external thread can comprise at least one thread turn. A thread pitch of the at least one thread turn of the external thread can be the same as a thread pitch of the internal thread. A diameter of the external thread can be matched to a diameter of the internal thread.

The first contact and the second contact can be electrically insulated from the threaded portion in the contact-making device. In this way contact can be easily achieved at points of the test object other than the internal surface of the threaded hole.

The first contact and the second contact can be arranged on the contact-making device so that they are spaced apart from an internal surface of the threaded hole, when the contact-making device is mechanically coupled to the internal thread of the threaded hole. The contacts can then be held in position mechanically through the threaded portion, while the contact for the current path and the contact for the voltage measurement is made outside of the threaded hole.

The first contact can be screw shaped and thus form the threaded portion. In this way the first contact can make conductive electrical contact of the test object with the internal surface of the threaded hole. Since the threaded portion can have a robust configuration, it represents a good electrical contact, for example, for the current path of a four-point measurement.

The second contact can be arranged on the contact-making device so that it is spaced apart from an internal surface of the threaded hole, when the contact-making device is mechanically coupled to the internal thread of the threaded hole. In this way a secure separation of the contact made for the current path and the contact made for the voltage measurement can take place even when the threaded portion screwed into the threaded hole itself forms the first contact.

The contact-making device can be designed so that both the first contact and the second contact are arranged in the threaded hole and sit against different areas of the internal surface of the threaded hole, when the contact-making device is mechanically coupled to the internal thread. For this purpose, the threaded portion that can be screwed into the threaded hole, can comprise both the first contact and the second contact. This allows a particularly compact design of the contact-making device.

The first contact can have a portion of at least one thread turn, and the second contact can have a further portion of the at least one thread turn. In this way on the contact-making device an external thread can be formed, allowing a secure anchoring in the threaded hole when the first contact and the second contact are both screwed into the threaded hole.

Through the electrical insulating material, the threaded portion can be divided into the first contact and the second contact. The electrically insulating material can extend in a plane between the halves of the threaded portion forming the first contact and the second contact. The electrically insulating material can extend fully between opposite ends of the threaded portion, in order to electrically insulate the first contact and the second contact from one another.

At least one of the first contact and the second contact can be a spring-loaded contact. The spring-loaded contact can be designed for engagement with the internal thread.

The first contact can be a first jaw of a clamp, and the second contact can be a second jaw of a clamp. The first contact and the second contact can be moveable in relation to one another.

The contact-making device can comprise a pressure element, which pushes the first contact and the second contact away from one another in a springy manner.

The first contact and the second contact can each have teeth for engaging with the internal thread of the test object. The teeth of the first contact and the teeth of the second contact, respectively, can be arranged on external sides of the contact-making device pointing away from one another.

A distance between adjacent teeth of the first contact can correspond to a thread pitch of the internal thread. A distance between adjacent teeth of the second contact can correspond to the thread pitch of the internal thread.

When in use, the contact-making device, configured as a clamp, can be introduced into the threaded hole. The pressure element can push the teeth of the first contact and the teeth of the second contact into engagement with the internal thread, in order to secure the contact-making device to the test object.

A system according to an exemplary embodiment comprises a measuring device, designed to perform a resistance measurement. The system comprises a contact-making device according to an exemplary embodiment. The first contact and the second contact of the contact-making device can have an electrically conductive connection to the measuring device.

The first contact of the contact-making device can be connected to a current source of the measuring devices. The second contact of the contact-making device can be connected to a voltage measuring instrument of the measuring device.

The measuring device can be designed to perform a four-point measurement for a resistance measurement.

The system can comprise a further contact-making device according to an exemplary embodiment. The first contact and the second contact of the further contact-making device can have an electrically conductive connection with the measuring device. The first contact of the further contact-making device can be connected to the current source of the measuring device. The second contact of the further contact-making device can be connected to the voltage measuring instrument of the measuring device.

The system can comprise a test object with a threaded hole. The threaded hole can have an internal thread. The contact-making device can be mechanically coupled to the internal thread of the test object.

In a method for making electrical contact with a test object for a resistance measurement the test object comprises a threaded hole, having an internal thread. A contact-making device is mechanically coupled to the internal thread of the threaded hole, in order to make electrical contact of the test object for the resistance measurement to a first contact of the contact-making device and to a second contact of the contact-making device at, at least, two points. The first contact and the second contact of the contact-making device are electrically insulated from one another by an insulating material.

In the method via the first contact a current can be impressed in the test object. The second contact can be used for a voltage measurement.

The method can be performed with the contact-making device or the system according to an exemplary embodiment.

Further features of the method according to exemplary embodiments and the associated effects in each case correspond to the features and effects described by reference to the contact-making device and the system.

The test object can be an element of power engineering. The test object can be a switch or isolator for a high-voltage or medium-voltage network. The test object can be a circuit breaker, a load interrupter, a switch, a switch disconnector, an isolator or an earthing disconnector. In systems and methods according to exemplary embodiments the contact-making device can be used for a resistance measurement, with which the resistance of an abutting or clamping point of the test object, for example a high-voltage switch, is measured.

Contact-making devices, systems and methods according exemplary embodiments allow electrical contact for a voltage measurement of a current path and electrical contact for a voltage measurement of a four-point measurement to be made in a simple manner.

BRIEF DESCRIPTION OF THE FIGURES

The invention is explained in further detail in the following with reference to the drawings by means of preferred embodiments. In the drawings identical reference numerals are used to denote similar or identical elements.

DETAILED DESCRIPTION OF EXEMPLARY EMBODIMENTS

In the following exemplary embodiments are described in detail with reference to the figures. The features of the various exemplary embodiments can be combined with one another, unless this is expressly ruled out in the following description.

Even if some exemplary embodiments are described in the context of specific measurement methods for resistance measurement and/or in the context of specific test objects, the exemplary embodiments are not restricted to these.

Figure 1:
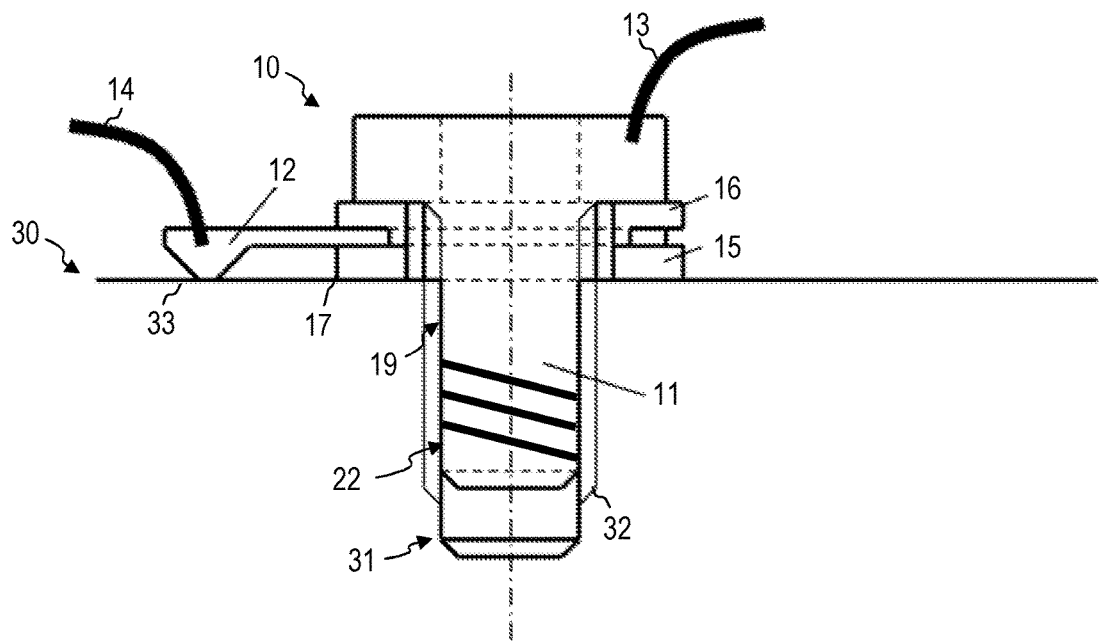
FIG. 1 is a sectional view of a contact-making device according to an exemplary embodiment, mechanically coupled to a test object.

FIG. 1 shows a sectional view of a system with a test object 30 and a contact-making device 10 according to an exemplary embodiment. The test object 30 can be a high-voltage switch or other power engineering element. The test object 30 has a threaded hole 31. At least part of an Internal surface of the threaded hole 31 is provided with an internal thread 32.

The contact-making device 10 is designed to be attached to the internal thread 32. The contact-making device 10 has a first contact 11 and a second contact 12, in order to make electrical contact between the test object 30 and the metal surrounding the threaded hole 32. An electrical cable 13 can connect the first contact 11 with a measuring device. The measuring device can comprise a current source, which via the first contact 11 and another contact (not shown in FIG. 1) performs a voltage measurement can impress a direct current in the test object 30. An electrical cable 14 can connect the second contact 12 with the measuring device. The measuring device can comprise a voltage measuring instrument, which via the second contact 12 and a further contact (not shown in FIG. 1) performs a voltage measurement.

The contact-making device 10 is designed to be attached to the internal thread 32. The contact-making device 10 has a first contact 11 and a second contact 12, in order to make electrical contact between the test object 30 and the metal surrounding the threaded hole 32. An electrical cable 13 can connect the first contact 11 with a measuring device. The measuring device can comprise a current source, which via the first contact 11 and another contact (not shown in FIG. 1) performs a voltage measurement and can impress a direct current in the test object 30. An electrical cable 14 can connect the second contact 12 with the measuring device. The measuring device can comprise a voltage measuring instrument, which via the second contact 12 and a further contact (not shown in FIG. 1) performs a voltage measurement.

In the contact-making device 10 of FIG. 1 the second contact 12 is configured so that it is located completely outside of the threaded hole 31, when the contact-making device 10 is attached to the test object 30 through the thread engagement. By means of an electrically insulating material, for example by means of insulating washers 15, 16, 17, the second contact 12 can be insulated from the first contact 11. The second contact 12 can be located resting fully at a point 33 of the test object 30, when the threaded portion 19 is screwed into the threaded hole 10, in order to mechanically secure the contact-making device 10 to the test object 30.

In the contact-making device 10, shown in FIG. 1, the threaded portion 19 itself serves as the first contact. This allows, for example, a current to be impressed for a four-point resistance measurement via the internal surface of the threaded hole 31. The second contact 12 can sit on a point 33 of the test object 30 and can be pushed by the contact-making device 10 against the point 33, which does not directly delimit the threaded hole.

The contact-making device 10 with the threaded portion 19, which also serves as the first contact 11, the second contact 12 and the insulating material 15, 16, 17 can be configured as an integral unit, that is to say as a contact-making element, that can be attached to the test object 30, in order to rest the first contact 11 and the second contact 12 against the test object 30.

Figure 2:
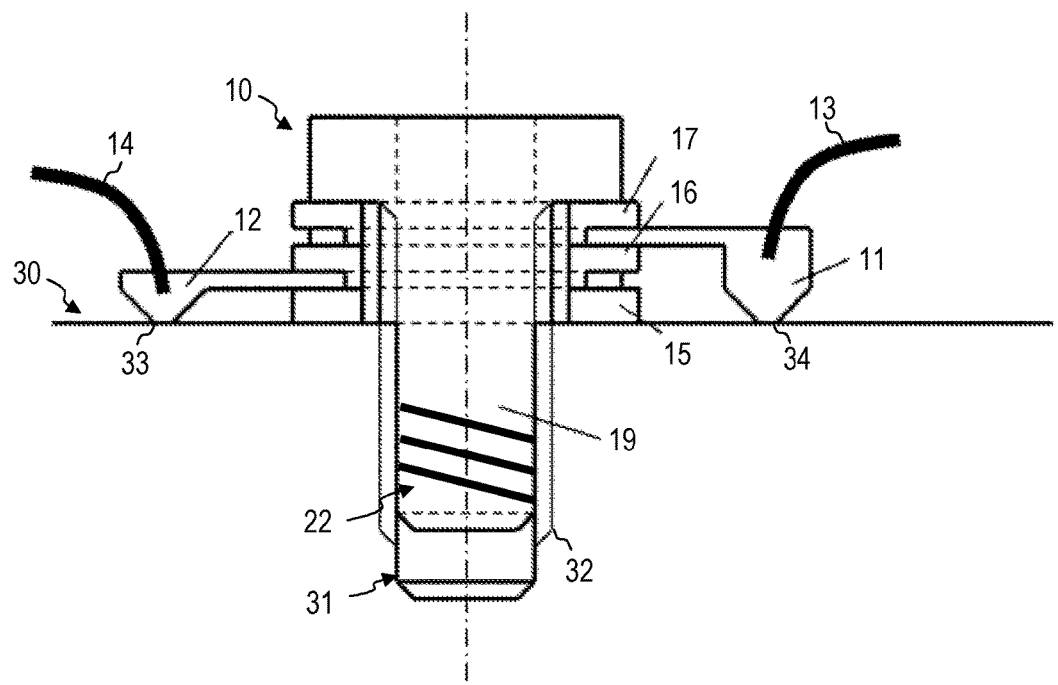
FIG. 2 is a sectional view of a contact-making device according to a further exemplary embodiment, mechanically coupled to a test object.

FIG. 2 shows a system with a contact-making device 10 according to a further exemplary embodiment. In the contact-making device 10 the threaded portion 19 together with the external thread 22 serves only for the mechanical securing of the contact-making device 10 to the test object 30.

The first contact 11 is electrically insulated by means of an insulating material, for example insulating washers 15, 16, 17, from the threaded portion 19 and the second contact 12. The contact-making device 10 is designed to push the first contact 11 against a portion of the test object 30, which is spaced apart from the internal surface of the threaded hole. The second contact 12 is, as described with reference to FIG. 1, insulated by means of an insulating material from the threaded portion 19. Accordingly, the threaded portion 19 itself does not function as a contact, via which current is impressed or a potential tapped for a voltage measurement. The threaded portion 19 can also itself comprise an insulating material.

As shown in FIG. 2, the first contact 11 and the second contact 12 can for example protrude in opposite directions from the threaded portion 19. Other geometries can be used.

Figure 3:
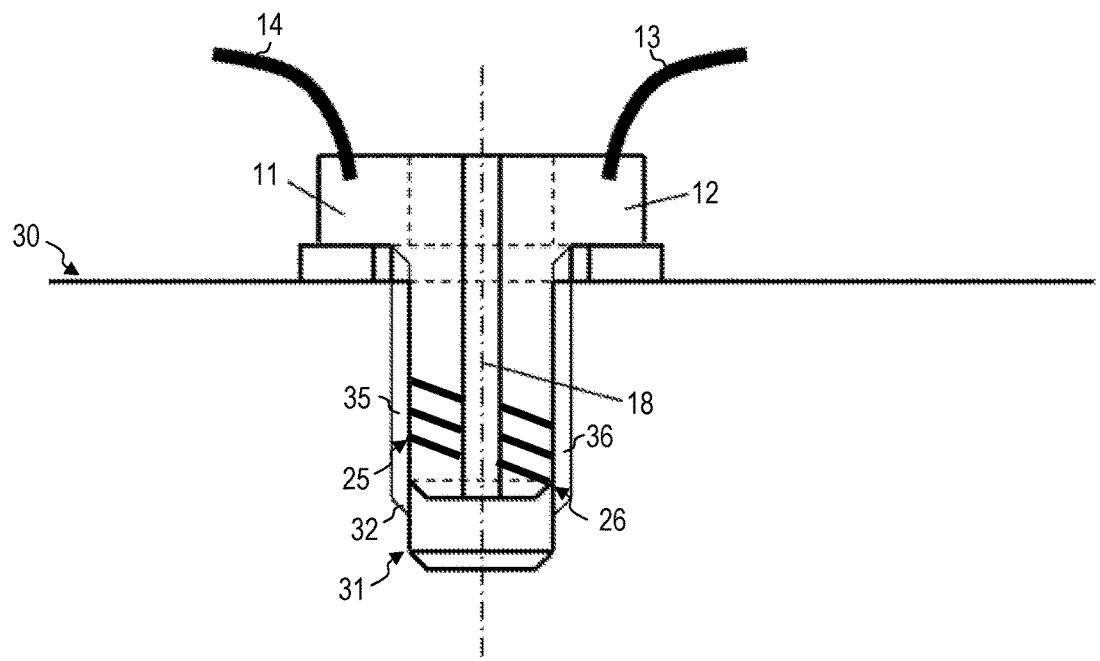
FIG. 3 is a sectional view of a contact-making device according to a further exemplary embodiment, mechanically coupled to a test object.

FIG. 3 shows a system with a clamping device 10 with a screw-shaped design. The clamping device 10 is formed by a first contact 11, a second contact 12 and an insulating layer 18 arranged in between.

When the clamping device 10 is brought into thread engagement with the internal thread 32 of the threaded hole 31, the first contact 11 and the second contact 12 extend into the threaded hole 31. The first contact 11 rests on an area 35 of the internal surface of the threaded hole 31. At the area 35 via the first contact 11 for example a current can be impressed in the test object 30. The second contact 12 rests on a further area 36 of the internal surface of the threaded hole 31. At the further area 36 via the second contact 12 for example a potential for a voltage measurement can be captured with the four-point method.

For a secure fixing of the contact-making device 10 to the internal thread 32 of the threaded hole 31 at least one thread turn can extend along the first contact 11 and along the second contact 12. A portion 25 of a thread turn can be configured on the first contact 11. The thread turn can have a further portion 26, configured on the second contact 12. The portions 25, 26 of the thread turn are designed, in order to engage with a thread turn of the internal thread 31. The portions 25, 26 of the thread turn have the same thread pitch.

The part of the first contact 11, which in the installed state is located in the threaded hole 31, can have the form of a cylindrical section. The part of the second contact 32, which in the installed state is located in the threaded hole 31, can similarly have the form of a cylindrical section. The parts of the first contact 11 and of the second contact 12 can for example have cylindrical sections, the base area of which is smaller than the semicircle. The insulating layer 18 can extend between the first contact 11 and the second contact 12. The insulating layer 18 can extend along a central axis of the contact-making device 10.

A contact-making device 10, as explained by reference to FIG. 3, can also be advantageously used, when the connection point of the test object 30 is small. For example, the contact-making device 10, explained by reference to FIG. 3, can also be used when only a small circular area around the threaded hole 31 is available for making the electrical contact.

Figure 4:
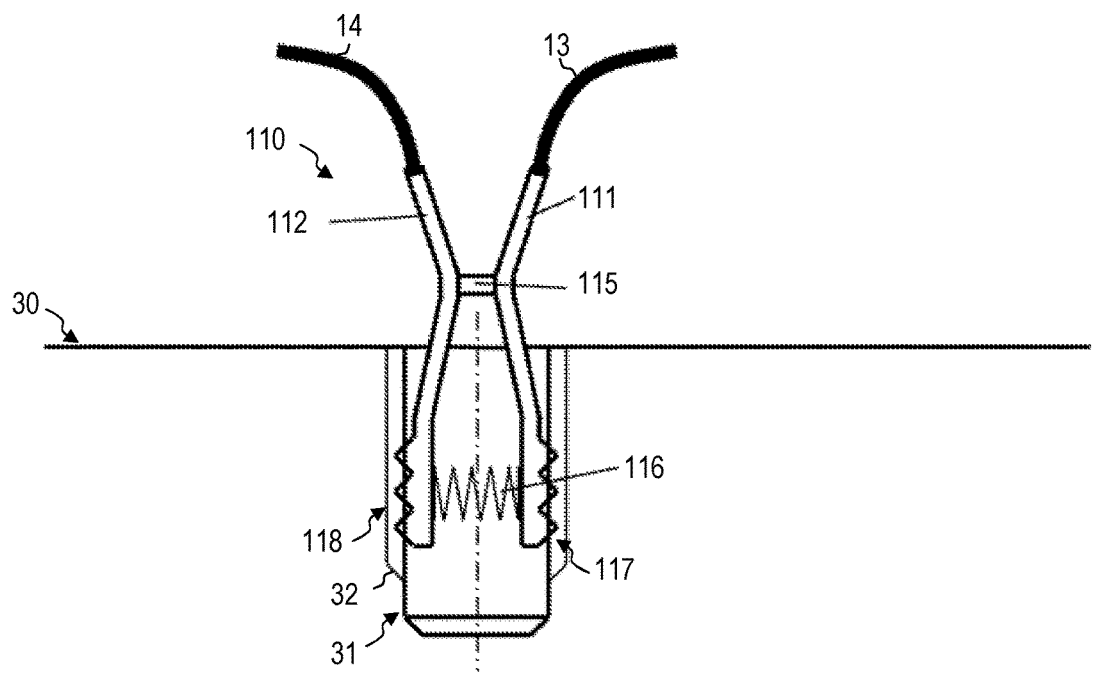
FIG. 4 is a sectional view of a contact-making device according to a further exemplary embodiment, mechanically coupled to a test object.

FIG. 4 shows a system with a contact-making device 110 according to a further exemplary embodiment.

The contact-making device 110 is designed as a clamp. The contact-making device 110 has a first contact 111, configured as a jaw of the clamp. The contact-making device 110 has a second contact 112, configured as a further jaw of the clamp.

The first contact 111 has on a side, turned away from the second contact 112, a tooth or a plurality of teeth 117. The second contact 112 has on a side, turned away from the first contact 111, a tooth or a plurality of teeth 118. A size of the tooth or teeth 117, 118 and a distance between adjacent teeth can be matched to the internal thread 32. For example, a distance between the teeth 117, 118 can be selected so that it is the same as the thread pitch of the internal thread 32. The teeth 117, 118 are configured on the outsides of the clamping device 110 pointing away from one another, in order to allow the securing of the clamping device in the internal thread 32.

The contact-making device 110 comprises a compression spring 116 or another pressure element, which pushes the first contact 111 and the second contact 112 away from one another in a spring-like manner. Unlike conventional Kelvin clamps the first contact 111 and the second contact 112 are pre-tensioned away from one another and not towards one another.

The first contact 111 and the second contact 112 are mechanically coupled by a bracket 115, but electrically insulated from one another. The bracket 115 can for example consist of an insulating material or comprise an insulating material, in order to electrically insulate the first contact 111 and the second contact 112 from one another.

When the clamping device 110 is used, the first contact 111 and the second contact 112 are inserted in the screw hole 31 of the test object 30. The compression spring 116 pushes the first contact 111 and the second contact 112 apart and thereby pushes the teeth 117, 118 against the internal thread 32 of the threaded hole 31. This clamping device 110 can also be used with test objects where the connection point has small dimensions about the threaded hole 31.

In the contact-making devices 10, 110 according to the various exemplary embodiments the first contact and the second contact can in each case comprise a suitable conductive material, for example metal or a metal alloy.

For a resistance measurement a contact-making device according to an exemplary embodiment can be used in combination with one or more conventional clamps. Two contact-making devices according to exemplary embodiments can also be used. Here, one contact-making device serves to provide an electrical contact for injection of the current and a further electrical contact to tap a potential for a voltage measurement.

Figure 5:
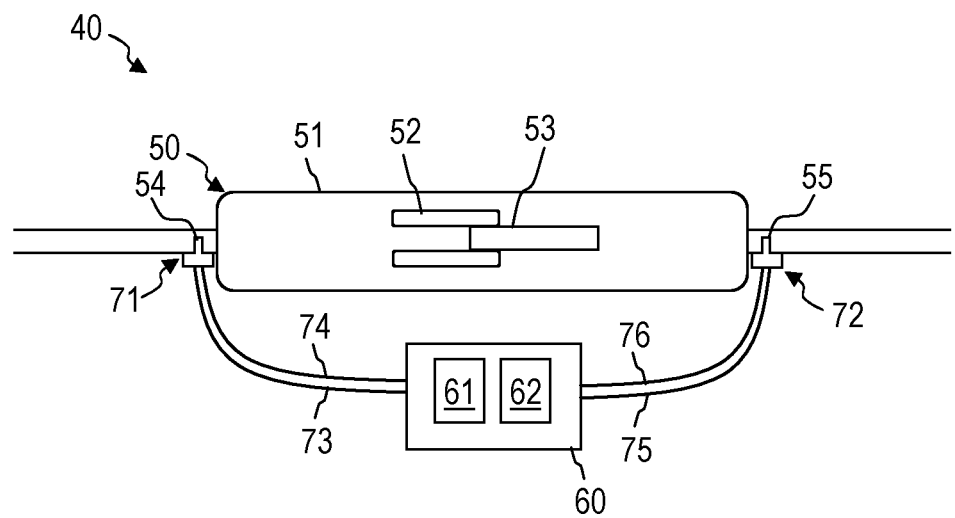
FIG. 5 shows a system according to an exemplary embodiment.

FIG. 5 shows a system 40 according to an exemplary embodiment. The system 40 comprises a test object 50. The test object can be a high-voltage switch. The test object 50 can be a device for a high-voltage network or a medium-voltage network. The test object can comprise a plurality of electrodes 52, 53, at least one of which can be supported in a movable manner in a switch compartment 51.

In order to measure a resistance of the test object 50, for example of a switch or isolator in the closed state, a measuring device 60 of the system can be designed for a resistance measurement according to the four-point method. The measuring device 60 can comprise a current source 61. The current source 61 can be designed to impress a current of at least 10 Amperes on the test object 50. The measuring device 60 can comprise a voltage measuring instrument 62.

For a resistance measurement, the measuring device 60 can be connected by means of four cables with the test object 50. The test object 50 can comprise a connection point with a threaded hole 54 and a connection point with a further threaded hole 55. The threaded hole 54 and the further threaded hole 55 can for example be arranged on different sides of the impact contact of the electrodes 52, 53.

A contact-making device 71 is mechanically coupled to the threaded hole 54, so that the first contact and the second contact of the contact-making device 71 are pushed against the test object 50. A further contact-making device 72 is mechanically coupled to the further threaded hole 55, so that the first contact and the second contact of the further contact-making device 72 are pushed against the test object 50. The contact-making device 71 and the further contact-making device 72 can be designed as a contact-making device according to an exemplary embodiment and for example with reference to the embodiments described respectively in FIG. 1 to FIG. 4.

In order to impress a direct current on the test object 50, the direct current source 61 is connected by means of a cable 73 with the first contact of the contact-making device 71 and by means of a cable 75 with the first contact of the further contact-making device 72. For voltage measurement the voltage measuring instrument 62 is connected by means of a cable 74 with the second contact of the contact-making device 71 and via a cable 76 with the first contact of the further contact-making device 72.

The measuring device 60 can perform a resistance measurement as a four-point measurement. Here the contact-making device 71 provides both an electrical connection for impressing the current and an electrical connection for capturing a potential for the voltage measurement. The further contact-making device 72 similarly provides both an electrical connection for impressing the current and an electrical connection for capturing a potential for the voltage measurement.

A contact-making device according to an exemplary embodiment can also be used in combination with customary contact clamps as described in more detail with reference to FIG. 6.

Figure 6:
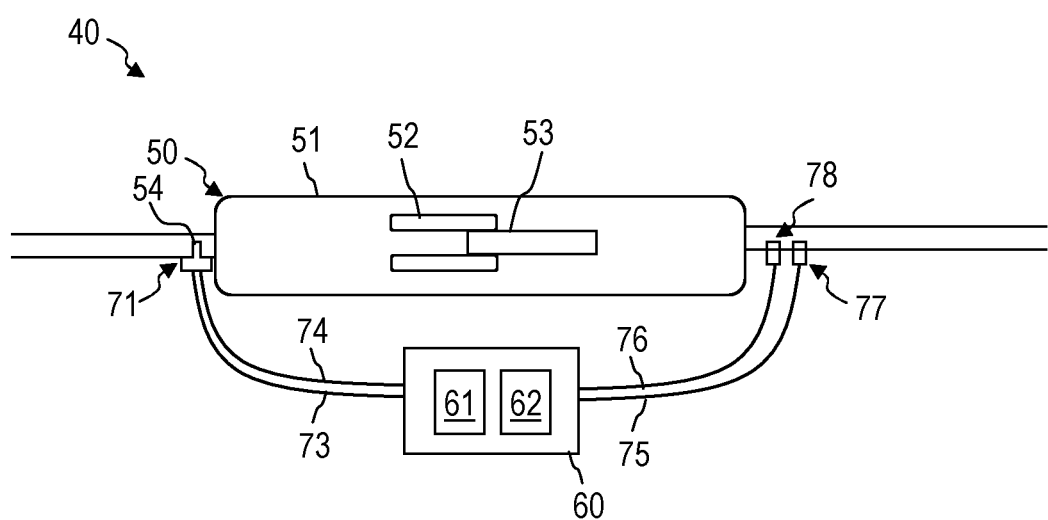
FIG. 6 shows a system according to a further exemplary embodiment.

FIG. 6 shows a system 40 according to an exemplary embodiment. The test object 50 has just one connection point with a threaded hole 54. A contact-making device 71 according to an exemplary embodiment is mechanically coupled to the internal thread of the threaded hole 54, so that the first contact and the second contact of the contact-making device 71 are pushed against the test object 50. On the opposite side of the impact contact between the electrodes 52, 53 the test object 50 does not need to have a further connection point with a threaded hole. A connection clamp 77, that can have a conventional design, can, together with the first contact of the contact-making device 71 be used for impressing the current for a four-point measurement. A further connection clamp 78, that can have a conventional design, can be used together with the second contact of the contact-making device 71 for voltage measurement for a four-point measurement.

While exemplary embodiments have been described in detail with reference to the figures, in further exemplary embodiments alternative or additional features can be used. While for example contact-making devices according to exemplary embodiments can be used for micro-ohm measurements, the contact-making devices can also be used for other resistance measurements.

While contact-making devices, systems and methods according to exemplary embodiments can be used in high-voltage switches or other devices for high-voltage or medium-voltage networks, they can also be used in combination with other electrical units. The contact-making devices can be used in quality testing, for example following production or prior to delivery or during a check in the installed state. If the connection point with the threaded hole during operation is connected with another cable, the contact-making device can temporarily also be coupled to the connection point, until the resistance measurement is complete.

Contact-making devices, systems and methods and systems according to exemplary embodiments allow simple and reliable electrical contact to be made with connection points having a threaded hole.

The invention claimed is:
1. A system, comprising:
   a measuring device configured to perform a resistance measurement by a four-point measurement; and
   a plurality of contact-making devices for making electrical contact with a test object that comprises a threaded hole, which has an internal thread,
   wherein each of the contact-making devices is designed for mechanical coupling to the internal thread of the threaded hole,
   wherein each of the contact-making devices comprises a first contact and a second contact, for making electrical contact with the test object at, at least, two points, and in use, one of the contact-making devices is mechanically coupled to the internal thread of the threaded hole,
   wherein the first contact and the second contact are electrically insulated from one another by an insulating material in each of the contact-making devices, and
   wherein the first contact and the second contact of each of the contact-making devices have an electrically conductive connection to the measuring device.
2. The system according to claim 1,
   wherein the one of the contact-making devices has a threaded portion, which is configured to be screwed into the threaded hole of the test object.
3. The system according to claim 2,
   wherein the threaded portion has an external thread, designed for threaded engagement with the threaded hole of the test object.
4. The system according to claim 2,
   wherein the first contact and the second contact are electrically insulated from the threaded portion in each of the contact-making devices.
5. The system according to claim 2,
   wherein the first contact and the second contact are arranged on the one of the contact-making devices so that they are spaced apart from an internal surface of the threaded hole, when the one of the contact-making devices is mechanically coupled to the internal thread of the threaded hole.

6. The system according to claim 2,
wherein the first contact forms the threaded portion, and
wherein the second contact is arranged on the one of the contact-making devices so that it is spaced apart from an internal surface of the threaded hole, when the one of the contact-making devices is mechanically coupled to the internal thread of the threaded hole.

7. The system according to claim 2,
wherein the threaded portion comprises both the first contact and the second contact.

8. The system according to claim 7,
wherein the first contact has a portion of at least one thread turn and the second contact a further portion of the at least one thread turn.

9. The system according to claim 7,
wherein the threaded portion is divided into the electrically insulating material in the first contact and the second contact.

10. The system according to claim 1,
wherein at least one of the first contact and the second contact is a spring-loaded contact.

11. The system according to claim 10,
wherein each of the contact-making devices comprises a pressure element, which pushes the first contact and the second contact away from one another in a springy manner.

12. The system according to claim 10,
wherein the first contact and the second contact each have teeth for engaging with the internal thread of the test object.

13. The system according to claim 10,
wherein the first contact and the second contact are arranged so that they make electrical contact with different areas of an internal surface of the internal thread of the threaded hole, when the one of the contact-making devices is mechanically coupled to the internal thread of the threaded hole.

14. The system according to claim 1, wherein the test object is a high-voltage switch.

15. A method for making electrical contact with a test object for a resistance measurement, wherein the test object comprises a threaded hole having an internal thread, wherein the method comprises:
creating a mechanical coupling between a contact-making device and the internal thread of the threaded hole, in order to make electrical contact with the test object for the resistance measurement with a first contact of the contact-making device and with a second contact of the contact-making device at, at least, two points, wherein the first contact and the second contact are electrically insulated from one another by an electrically insulating material in the contact-making device; and
impressing a current in the test object by the first contact, and using the second contact for voltage measurement.

16. The method according to claim 15,
wherein the first contact and the second contact of the contact-making device have an electrically conductive connection to a measuring device configured to perform a resistance measurement by a four-point measurement.

* * * * *